US007639073B2

(12) United States Patent
Deng et al.

(10) Patent No.: US 7,639,073 B2
(45) Date of Patent: Dec. 29, 2009

(54) SWITCHED-CAPACITOR AMPLIFIER WITH IMPROVED RESET PHASE

(75) Inventors: Liping Deng, Cupertino, CA (US);
Tiejun Dai, Sunnyvale, CA (US);
Haidong Guo, Sunnyvale, CA (US);
Chieh-Chien Lin, Santa Clara, CA (US); Yu-Shen Yang, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 11/941,869

(22) Filed: Nov. 16, 2007

(65) Prior Publication Data

US 2009/0128232 A1 May 21, 2009

(51) Int. Cl.
*H03F 1/02* (2006.01)
(52) U.S. Cl. ............................................. 330/9; 330/69
(58) Field of Classification Search ...................... 330/9, 330/69, 252, 260; 327/124, 307
See application file for complete search history.

(56) References Cited

U.S. PATENT DOCUMENTS 5,084,639 A * 1/1992 Ribner ........................ 327/311
5,847,600 A * 12/1998 Brooks et al. ................. 330/9
7,456,684 B2 * 11/2008 Fang et al. ..................... 330/9
2005/0046480 A1 3/2005 Dyer et al.
2007/0023668 A1 2/2007 Dhurjaty

OTHER PUBLICATIONS

Razavi, B., "Design of Analog CMOS Integrated Circuits," McGraw-Hill, 2001, pp. 471-476.
C.C. Enz and G.C. Temes, "Circuit Techniques for Reducing the effect of Op-Amp Imperfections: Autozeroing, Correlated Double Sampling, and Chopper Stabilization," Proceedings of the IEEE, vol. 84, No. 11, pp. 1584-1614, Nov. 1996.
PCT/US2008/082532 International Search Report and Written Opinion of the International Searching Authority, mailed Feb. 19, 2009, 9 pages.

* cited by examiner

*Primary Examiner*—Henry K Choe
(74) *Attorney, Agent, or Firm*—Blakely Sokoloff Taylor & Zafman LLP

(57) ABSTRACT

A switch-capacitor ("SC") amplifier includes a two-stage operational amplifier ("OP-AMP"), an input SC network, and a feedback SC network. The two-stage OP-AMP includes a first OP-AMP stage having an output coupled to an input of a second OP-AMP stage. The input SC network is coupled to an input of the first OP-AMP stage. The feedback SC network is configured to selectively couple the output of the first OP-AMP stage to the input of the first OP-AMP stage during a first phase of operation of the SC amplifier and to couple an output of the second OP-AMP stage to the input of the first OP-AMP stage during a second phase of operation of the SC amplifier.

14 Claims, 6 Drawing Sheets

SWITCHED-CAPACITOR AMPLIFIER WITH IMPROVED RESET PHASE

TECHNICAL FIELD

This disclosure relates generally to electronic circuits, and in particular but not exclusively, relates to switched-capacitor gain amplifiers.

BACKGROUND INFORMATION

Switched-capacitor ("SC") gain amplifiers have found wide applications in analog signal processing, such as automatic gain control ("AGC"), preamplifiers, analog-to-digital converters ("ADC"), and otherwise. A conventional SC gain amplifier 100 is shown in FIG. 1. SC gain amplifier 100 includes capacitors Cf and Cs, switches T1 to T6, and operational amplifier ("OP-AMP") 105 coupled in an integrator configuration. In FIG. 1, during operational phase 1 (often referred to as the reset or sampling phase), an input signal is sampled and stored on capacitors Cs. In operational phase 2 (amplification phase), the input signal is amplified. With this strategy, the offset and low frequency noise of OP-AMP 105 are stored in Cs during phase 1 and canceled in phase 2. OP-AMP 105 may be a one stage gain boost amplifier or a two-stage amplifier.

The type of OP-AMP 105 used depends on the particular application; however, a two-stage OP-AMP is common due to its relative high speed capability and large output voltage swing. FIG. 2 illustrates a conventional two-stage OP-AMP 200 that may be used to implement OP-AMP 105 in FIG. 1. However, the architecture of two-stage OP-AMP 200 suffers from stability issues. In particular it is difficult to design OP-AMP 200 such that it maintains operational stability during both the reset/sampling phase and the amplification phase.

The stability issues flow from the fact that the feedback factor is equal to one during the reset/sampling phase, but equal to Cf/(Cf+Cs+Cp) during the amplification phase. For example, if OP-AMP 200 is designed for an open loop bandwidth of 100 MHz and a beta=⅑ during the amplification phase, then OP-AMP 200 will have approximately an open loop bandwidth of 900 MHz during the sampling reset phase. To design such an op-amp with good phase margin stability in both phases is difficult and expensive. The situation is worse if the design of OP-AMP 200 calls for a smaller feedback factor during the amplification phase.

To compensate for these stability issues, conventional approaches include shorting the inputs and outputs of SC gain amplifier 100 to reference voltages during the sampling/reset phase. However, this technique necessitates costly reference circuitry, and the offset voltage of OP-AMP 105 is not cancelled. Additionally, during the sample/reset phase, the virtual ground terminal of OP-AMP 105 can be tied to true ground via a switch to reduce the feedback factor beta. However, this technique is sensitive to switch timing, mismatch, and other issues. In addition, auto-zero techniques, which include relatively costly circuitry, such as reference circuits, may affect the main amplifier performance.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

DETAILED DESCRIPTION

Embodiments of a system and method of operation for a switch-capacitor amplifier are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
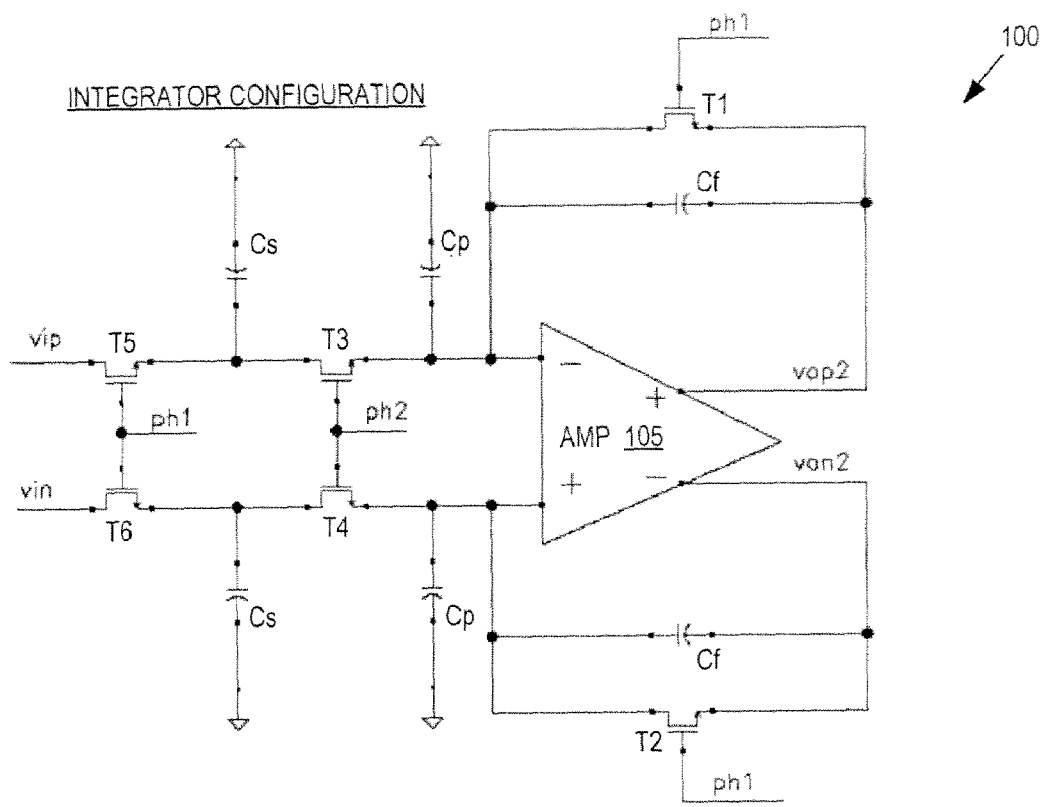
FIG. 1 is a circuit diagram illustrating a conventional switched-capacitor gain amplifier configured as an integrator.
Figure 2:
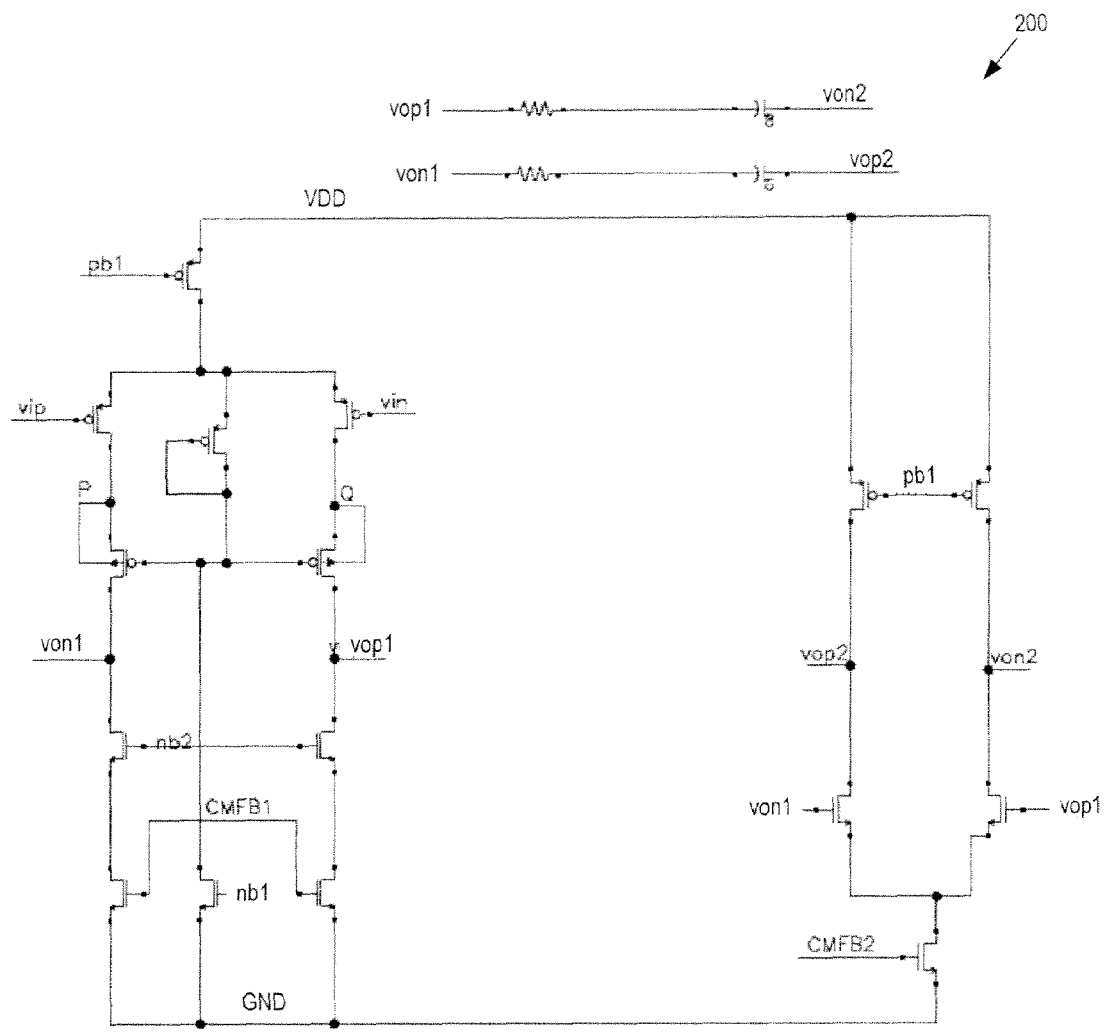
FIG. 2 is a circuit diagram illustrating a conventional two-stage operational amplifier for use with a switched-capacitor gain amplifier.
Figure 3:
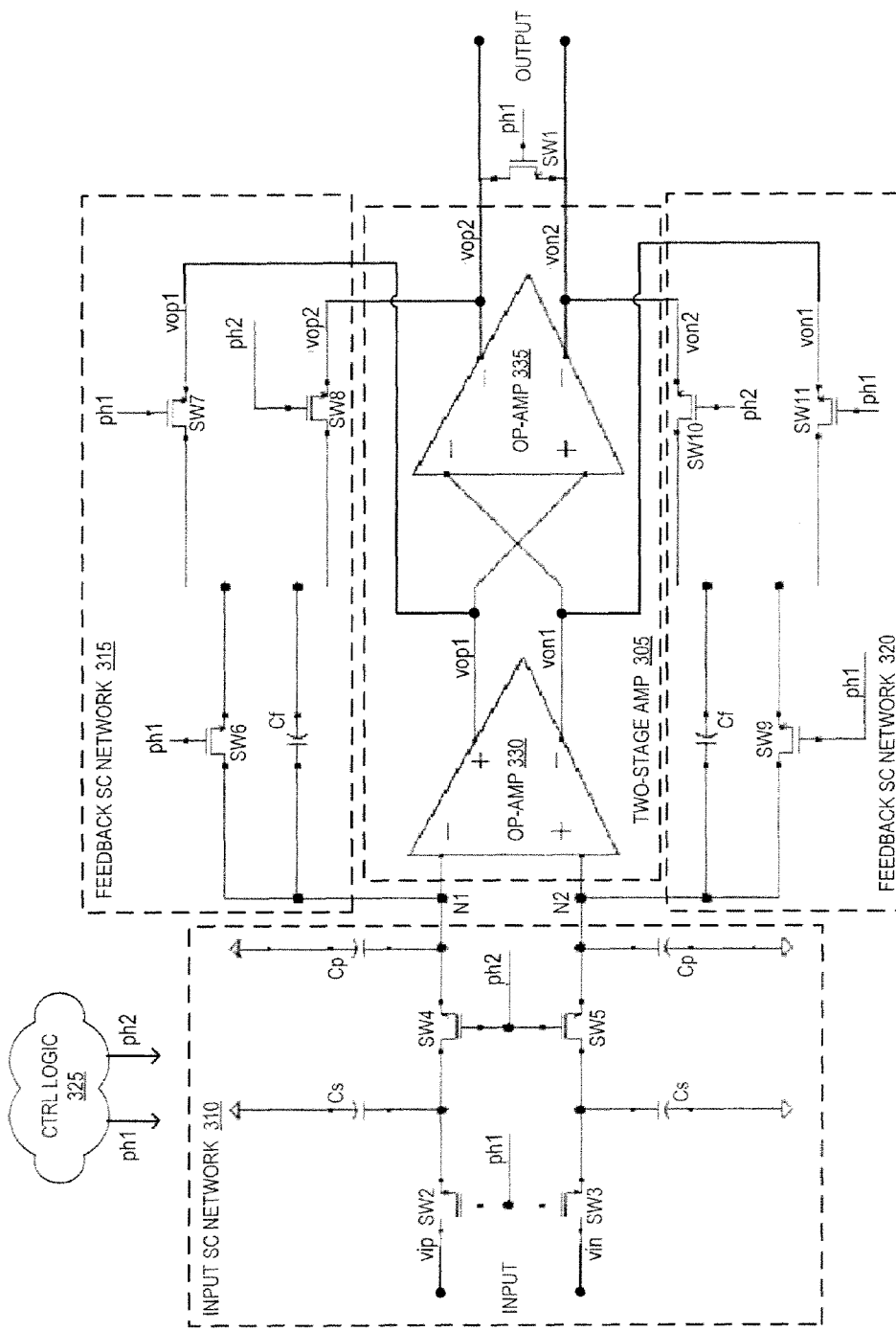
FIG. 3 is a circuit diagram illustrating a switched-capacitor amplifier, in accordance with an embodiment of the invention.

FIG. 3 is a circuit diagram illustrating a switched-capacitor ("SC") amplifier 300, in accordance with an embodiment of the invention. The illustrated embodiment of SC amplifier 300 includes a two-stage amplifier 305, an input SC network 310, feedback SC networks 315 and 320, a reset switch SW1, and control logic 325. The illustrated embodiment of two-stage amplifier 305 includes operational amplifiers ("OP-AMP") 330 and 335. The illustrated embodiment of input SC network 310 includes sampling capacitors Cs and switches SW2, SW3, SW4, and SW5. Note, parasitic capacitors Cp are not actual circuit elements, but rather represent real world parasitic capacitances internal to the circuit. Feedback SC network 315 includes a feedback capacitor Cf and switches SW6, SW7, and SW8, while feedback SC network 320 includes a feedback capacitor Cf and switches SW9, SW10, and SW11.

As illustrated, control logic 325 generates control signals ph1 and ph2 for switching SW1 through SW11. In one embodiment, switches SW1-SW11 are transistors (e.g., MOSFETs). During a first phase of operation (sample/reset phase), control signal ph1 is asserted and coupled to switches SW1, SW2, SW3, SW6, SW7, SW9, and SW11. Otherwise, ph1 is generated to disable these switches. During a second phase of operation (amplification phase), control signal ph2 is asserted and coupled to switches SW4, SW5, SW8, and SW10. Otherwise, ph2 is generated to disable these switches.

In the illustrated embodiment, two-stage amplifier 305 is a differential amplifier which samples differential input signals vip and vin at input SC network 310 and outputs differential output signals vop2 and von2 from two-stage amplifier 305. The input of OP-AMP 330 is coupled to input SC network 310 while the output of OP-AMP 330 is coupled to the input of OP-AMP 335. Feedback SC networks 315 operate to short the output of OP-AMP 330 to its input (virtual ground) during phase 1 and form a feedback path coupling the output of OP-AMP 335 to the input of OP-AMP 330 through feedback capacitors Cf during phase 2.

Figure 4:
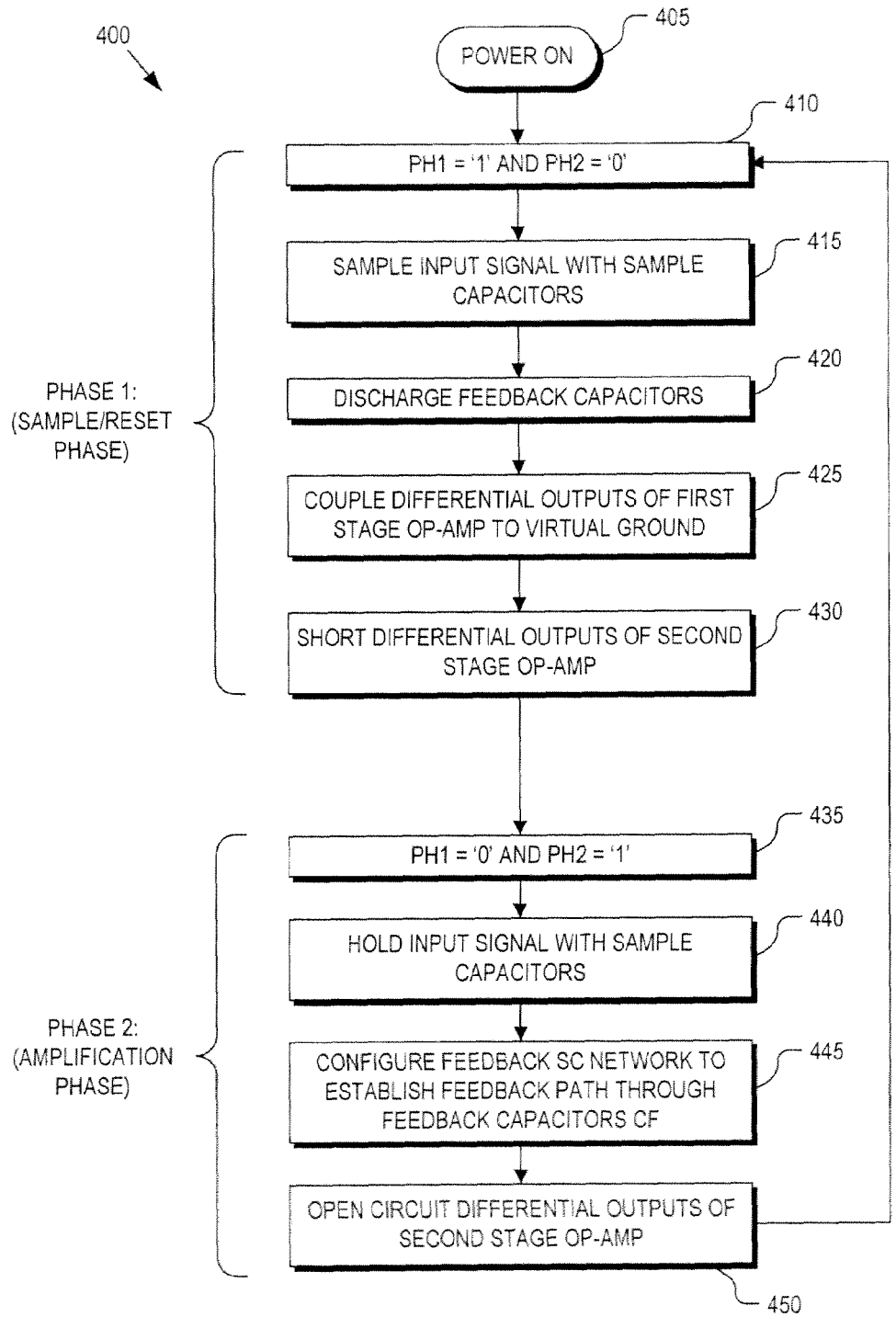
FIG. 4 is a flow chart illustrating operation of a switched-capacitor amplifier, in accordance with an embodiment of the invention.

FIG. 4 is a flow chart illustrating a process 400 for operating SC amplifier 300, in accordance with an embodiment of the invention. The order in which some or all of the process blocks appear in process 400 should not be deemed limiting. Rather, one of ordinary skill in the art having the benefit of the present disclosure will understand that some of the process blocks may be executed in a variety of orders not illustrated.

In a process block 405, SC amplifier 300 is turned on by applying power to the power rails. In a process block 410, control logic 325 asserts control signal ph1 and deasserts control signal ph2. Asserting control signal ph1 causes input switches SW2 and SW3 to close circuit, thereby allowing sampling capacitors Cs to sample the differential input signals vip and vin (process block 415). Since ph2 is deasserted, switches SW4 and SW5 are open circuited to isolate two-stage amplifier 305 from input SC network 310. Isolating input SC network 310 during phase 1 enables feedback SC networks 315 and 320 to reset while sampling the input signals. In a process block 420, switches SW6 and SW9 are close circuited, thereby shorting the terminals of each feedback capacitor Cf and discharging/resetting feedback capacitors Cf.

In a process block 425, SW7 and SW11 are closed circuited in addition to SW6 and SW9 forming a short circuit feedback path from the intermediate output of the first stage OP-AMP 330 to its input virtual ground (nodes N1 and N2). Coupling the intermediate output of OP-AMP 330 to its input creates a shorter feedback path during the reset phase than coupling the output of the second stage OP-AMP 335 to the input of the first stage OP-AMP 330. The shorter feedback path during the reset phase reduces the design constraints on SC amplifier 300 and makes circuit stability more easily achieved. The shorter feedback path makes it easier to design a stable circuit during both phases of operation without ringing problems.

In a process block 430, control signal ph1 is also applied to reset switch SW1 thereby shorting the differential outputs vop2 and von2 of OP-AMP 335. Shorting the differential outputs of OP-AMP 335 has the effect of reducing the capacitive load reflected back on the first stage OP-AMP 330. Reducing the capacitive load increases the performance of two-stage amplifier 305.

Once the sampling/reset phase (phase 1) is complete, control logic 325 deasserts control signal ph1 and asserts control signal ph2 (process block 435). Toggling of control signals ph1 and ph2 signifies the transition from the sampling/reset phase to the amplification phase (phase 2). During phase 2, the illustrated embodiment of two-stage amplifier 305 is arranged in an integrated feedback configuration. However, it should be appreciated that other configurations of feedback SC network 315 and input SC network 310 may be used including simple gain configurations.

During phase 2, switches SW2 and SW3 are open circuited, thereby disconnecting sampling capacitors Cs from the differential input signals vip and vin. In a process block 440, sampling capacitors Cs hold the differential input signals and are coupled to the input of OP-AMP 330 via close circuiting input switches SW4 and SW5. In a process block 445, feedback SC networks 315 and 320 are configured under control of control logic 325 to establish feedback paths through the feedback capacitors Cf. In the illustrated embodiment, switches SW6, SW7, SW9, and SW11 are open circuited, while feedback switches SW8 and SW10 are close circuited. Finally, in a process block 450, reset switch SW1 is open circuited to allow differential output signals vop2 and von2 to be output from two-stage amplifier 305.

It should be appreciated that although process blocks 405 through 450 are illustrated as sequential operations, many of the process blocks may occur simultaneously. For example, the operations occurring during phase 1 may all occur substantially at the same time while the operations occurring during phase 2 may occur substantially at the same time. Once phase 2 is complete, process 400 loops back to process block 410 and repeats as described above.

As previously mentioned, coupling the intermediate output of the first stage OP-AMP 330 to its input (virtual ground) creates a shorter feedback path during the reset phase, which reduces the design constraints on SC amplifier 300 and makes circuit stability more easily achieved. Additionally, coupling outputs vop2 and von2 of the second stage OP-AMP 335 reduces the capacitive load reflected back on the first stage OP-AMP 330, thereby extending the operational bandwidth of SC amplifier 300. Circuit elements can be adjusted to achieve the desired amplifier performance including the gate size of reset switch SW1, the capacitance of capacitors Cf, Cs, and Cp, and the resistance or size of feedback switches SW8, SW10. Other internal circuit components of two stage OP-AMP 305 may also be adjusted to achieve the desired circuit performance, as discussed below.

Figure 5:
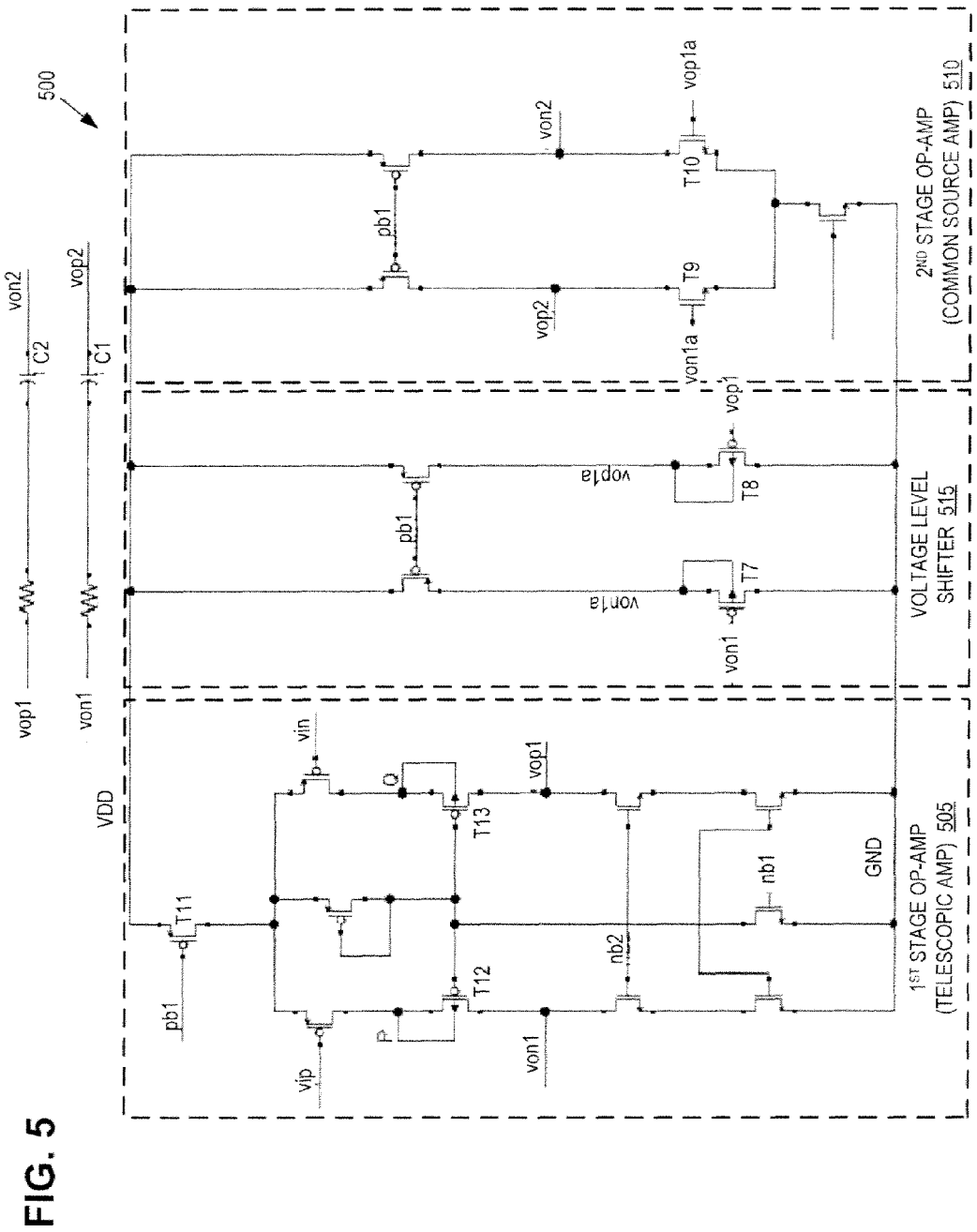
FIG. 5 is a circuit diagram illustrating a two-stage operational amplifier, in accordance with an embodiment of the invention.

FIG. 5 is a circuit diagram illustrating a two-stage amplifier 500, in accordance with an embodiment of the invention. Two-stage amplifier 500 is one possible implementation of two-stage amplifier 305 illustrated in FIG. 3. The illustrated embodiment of two-stage amplifier 500 includes a first stage OP-AMP 505 (also referred to as a telescopic amplifier), a second stage OP-AMP 510 (also referred to as a common source amplifier), and a voltage level shifter 515.

As illustrated, voltage level shifter 515 is coupled between first and second stage OP-AMPs 505 and 510. In particular, intermediate outputs von1 and vop1 from first stage OP-AMP 505 are coupled to the gates of transistor T7 and T8, respectively, of voltage level shifter 515. Correspondingly, the source terminals of transistors T7 and T8 are coupled to the gates of transistors T9 and T10 of second stage OP-AMP 510, respectively. Voltage level shifter 515 operates to translate the output voltage of first stage OP-AMP 505 to the input voltage of second stage OP-AMP 510. Voltage level shifter 515 may be configured to provide varying degrees of voltage level shifting dependent upon the particular application of SC amplifier 300. Another circuit handle or feature that can be adjusted, in additional to those listed above, to achieve large phase margin, and therefore circuit stability, includes the time constants at circuit nodes P and Q within first stage OP-AMP 505. These time constants can be adjusted by changing the current through transistor T11 by appropriate bias of signal pb1 or by adjusting the size of transistors T12 and T13.

Figure 6:
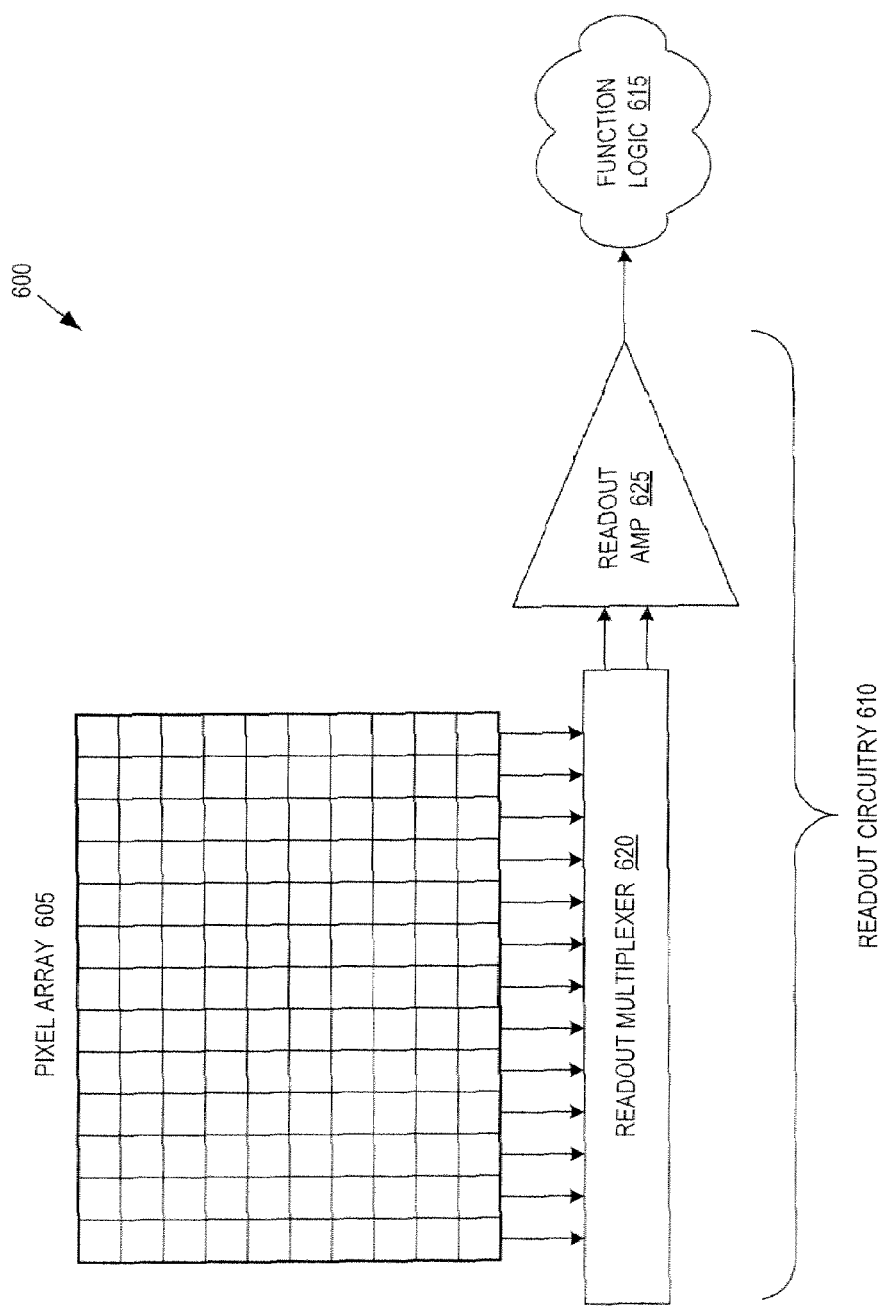
FIG. 6 is a block diagram illustrating an imaging system including a pixel array and a readout amplifier to amplify image data acquired by the pixel array, in accordance with an embodiment of the invention.

FIG. 6 is a block diagram illustrating an imaging system 600, in accordance with an embodiment of the invention. Imaging system 600 is a demonstrative system which may incorporate embodiments of SC amplifier 300; however, it should be appreciated that other devices such as preamplifiers, analog-to-digital converters, or otherwise may also be implemented with SC amplifier 300. The illustrated embodiment of imaging system 600 includes a pixel array 605, readout circuitry 610, and function logic 615. The illustrated embodiment of readout circuitry 610 includes a readout multiplexer 620 and a readout amplifier 625. Readout amplifier 625 may be implemented with embodiments of SC amplifier 300 and two-stage amplifier 500.

During operation, pixel array 605 is exposed to impinging light carrying an image, causing pixel array 605 to acquire image data. In one embodiment, pixel array 605 is a two-dimensional array of complementary metal oxide semiconductor ("CMOS") optical sensors. Once the image data is acquired by pixel array 605, readout multiplexer 620 sequentially scans out the image data from each column or row as differential signal data. The scanned out image data is sequentially amplified by readout amplifier 625 and provided to function logic 615. Function logic 615 may include software logic, hardware logic, or a combination of both, for storing or manipulating the image data.

The processes explained above are described in terms of computer software and hardware. The techniques described may constitute machine-executable instructions embodied within a machine (e.g., computer) readable medium, that when executed by a machine will cause the machine to perform the operations described. Additionally, the processes may be embodied within hardware, such as an application specific integrated circuit ("ASIC") or the like.

A machine-accessible medium includes any mechanism that provides (i.e., stores) information in a form accessible by a machine (e.g., a computer, network device, personal digital assistant, manufacturing tool, any device with a set of one or more processors, etc.). For example, a machine-accessible medium includes recordable/non-recordable media (e.g., read only memory (ROM), random access memory (RAM), magnetic disk storage media, optical storage media, flash memory devices, etc.).

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. An apparatus, comprising:
  a two-stage operational amplifier ("OP-AMP") including a first OP-AMP stage having an output coupled to an input of a second OP-AMP stage;
  an input switched-capacitor ("SC") network coupled to an input of the first OP-AMP stage, the input SC network including switches coupled to sample an input signal during a first phase of operation of the apparatus and coupled to provide the sampled input signal to the input of the first OP-AMP stage during a second phase of operation of the apparatus; and
  a feedback SC network coupled to selectively couple the output of the first OP-AMP stage to the input of the first OP-AMP stage during the first phase of operation of the apparatus and to couple an output of the second OP-AMP stage to the input of the first OP-AMP stage during the second phase of operation of the apparatus.

2. The apparatus of claim 1, wherein the two-stage OP-AMP comprises a two-stage differential OP-AMP for receiving differential input signals on input paths of the first OP-AMP stage and for outputting differential output signals on output paths of the second OP-AMP stage.

3. The apparatus of claim 2, further comprising a reset switch coupled between the output paths of the second OP-AMP stage to selectively couple the output paths during the first phase of operation of the apparatus.

4. The apparatus of claim 2, wherein the feedback SC network comprises:
  a first feedback SC network to couple a positive differential output of the first OP-AMP stage to a negative differential input of the first OP-AMP stage during the first phase of operation; and
  a second feedback SC network to couple a negative differential output of the first OP-AMP stage to a positive differential input of the first OP-AMP stage during the first phase of operation.

5. The apparatus of claim 4, wherein the first feedback SC network is further configured to selectively couple a positive differential output of the second OP-AMP stage to the negative input of the first OP-AMP stage through a first feedback capacitor during the second phase of operation, and wherein the second feedback SC network is further configured to selectively couple a negative differential output of the second OP-AMP stage to the positive differential input of the first OP-AMP stage through a second feedback capacitor during the second phase of operation.

6. The apparatus of claim 2, wherein the two-stage differential OP-AMP further comprises a voltage level shifter coupled between the first OP-AMP stage and the second OP-AMP stage, the voltage level shifter to convert a first voltage level output from the first OP-AMP stage to a second voltage level input into the second OP-AMP stage.

7. The apparatus of claim 6, wherein the first OP-AMP stage comprises a telescopic amplifier and the second OP-AMP stage comprises a common source amplifier.

8. The apparatus of claim 1, further comprising control logic coupled to the input SC network and to the feedback SC network, the control logic to assert a first control signal during the first phase of operation and to assert a second control signal during the second phase of operation, the input SC network and the feedback SC network responsive to the first and second control signals.

9. A method of operation of a switched-capacitor ("SC") circuit including a two-stage operational amplifier ("OP-AMP"), a feedback SC network, and an input SC network, the method comprising:
  sampling a differential input signal with the input SC network during a first phase of operation of the SC circuit;
  coupling differential outputs of a second stage of the two-stage OP-AMP to each other during the first phase;
  coupling the sampled differential input signal to an input of a first stage of the two-stage OP-AMP during a second phase; and
  feeding back a differential output signal from the second stage to input to the first stage of the two-stage OP-AMP via the feedback SC network during the second phase of operation of the SC circuit while amplifying the differential input signal.

10. The method of claim 9, further comprising temporarily coupling differential outputs from the first stage to differential inputs of the first stage during the first phase of operation.

11. The method of claim 10, further comprising discharging feedback capacitors within the feedback SC network during the first phase.

12. The method of claim 10, further comprising shifting a voltage level output from the first stage to a different voltage level input into the second stage.

13. The method of claim 9, wherein coupling the differential outputs of the second stage of the two-stage OP-AMP to each other during the first phase comprises close circuiting a transistor switch coupling the differential outputs together.

14. The method of claim 9, wherein the input SC network and the feedback SC network configure the two-stage OP-AMP to perform an integration function.

* * * * *